(12) United States Patent
Sharma et al.

(10) Patent No.: US 10,700,652 B2
(45) Date of Patent: Jun. 30, 2020

(54) ETHERNET LINE DRIVER

(71) Applicant: TEXAS INSTRUMENTS INCORPORATED, Dallas, TX (US)

(72) Inventors: Vikram Sharma, Bangalore (IN); Gokul Koraganji, Bangalore (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 26 days.

(21) Appl. No.: 16/192,790

(22) Filed: Nov. 15, 2018

(65) Prior Publication Data
US 2020/0091883 A1 Mar. 19, 2020

Related U.S. Application Data

(60) Provisional application No. 62/732,000, filed on Sep. 17, 2018.

(51) Int. Cl.
*H03F 3/45* (2006.01)
*H04L 25/02* (2006.01)

(52) U.S. Cl.
CPC ..... *H03F 3/45174* (2013.01); *H04L 25/0278* (2013.01); *H03F 2203/45022* (2013.01); *H03F 2203/45182* (2013.01); *H03F 2203/45322* (2013.01)

(58) Field of Classification Search
CPC ..... H03F 3/45; H04L 25/028; H04L 25/0272; H04L 25/0278
USPC ........................ 330/255; 326/82, 86; 327/108
See application file for complete search history.

(56) References Cited

U.S. PATENT DOCUMENTS 8,896,351 B2 * 11/2014 Wenske .............. H04L 25/0264
                                                                    327/108
10,199,989 B2 * 2/2019 Seth ...................... H03F 1/0277

FOREIGN PATENT DOCUMENTS

| RU | 2474958 | 2/2013 |
|---|---|---|
| WO | 1994006244 | 3/1994 |
| WO | 2001091437 | 11/2001 |

OTHER PUBLICATIONS

International Search Report in corresponding PCT Application No. PCT/2019/051555, dated Dec. 19, 2019 (2 pages).

* cited by examiner

*Primary Examiner* — Steven J Mottola
(74) *Attorney, Agent, or Firm* — John R. Pessetto; Charles A. Brill; Frank D. Cimino (57) ABSTRACT

Some aspects of the disclosure provide for a circuit. In an example, the circuit includes an amplifier, a first transistor network, a second transistor network, a first resistor, a second resistor, and a third resistor. The amplifier has first and second inputs and first, second, third, and fourth outputs. The first transistor network is coupled to the first output of the amplifier and the second output of the amplifier. The second transistor network is coupled to the third output of the amplifier and the fourth output of the amplifier. The first resistor is coupled between the first transistor network and the second transistor network. The second resistor is coupled between the first transistor network and the first input of the amplifier. The third resistor is coupled between the second transistor network and the second input of the amplifier.

18 Claims, 4 Drawing Sheets

ETHERNET LINE DRIVER

CROSS-REFERENCE TO RELATED APPLICATIONS

The present application claims priority to U.S. Provisional Patent Application No. 62/732,000, which was filed Sep. 17, 2018, is titled "Low Area And Low Power Ethernet Line Driver Supporting Both 100BT and 10BTE," and is hereby incorporated herein by reference in its entirety.

SUMMARY

Some aspects of the disclosure provide for a circuit. In an example, the circuit includes an amplifier, a first transistor network, a second transistor network, a first resistor, a second resistor, and a third resistor. The amplifier has first and second inputs and first, second, third, and fourth outputs. The first transistor network is coupled to the first output of the amplifier and the second output of the amplifier. The second transistor network is coupled to the third output of the amplifier and the fourth output of the amplifier. The first resistor is coupled between the first transistor network and the second transistor network. The second resistor is coupled between the first transistor network and the first input of the amplifier. The third resistor is coupled between the second transistor network and the second input of the amplifier.

Other aspects of the disclosure provide for a circuit. In an example, the circuit includes a fully-differential amplifier, an output transistor stage, a mirrored stage, a first resistor, a second resistor, and a third resistor. The fully-differential amplifier has first and second inputs and first, second, third, and fourth outputs. The first resistor is coupled between the mirrored transistor stage and the output transistor stage. The second resistor is coupled between the mirrored transistor stage and the output transistor stage. The third resistor is coupled between first resistor and the second resistor.

Other aspects of the disclosure provide for a circuit. In an example, the circuit includes a driver, a receiver, and a controller. The current-mode driver includes a fully-differential amplifier, a first transistor network including a first transistor, a second transistor, a third transistor, and a fourth transistor, a second transistor network including a fifth transistor, a sixth transistor, a seventh transistor, and an eighth transistor, a first resistor, a second resistor, and a third resistor. The fully-differential amplifier has first and second inputs and first, second, third, and fourth outputs. The first transistor has a source terminal coupled to a voltage supply node, a drain terminal coupled to a first node, and a gate terminal coupled to the first output of the amplifier. The second transistor has a source terminal coupled to a ground node, a drain terminal coupled to the first node, and a gate terminal coupled to the second output of the amplifier. The third transistor has a source terminal coupled to the voltage supply node, a drain terminal coupled to a second node, and a gate terminal coupled to the first output of the amplifier. The fourth transistor has a source terminal coupled to the ground node, a drain terminal coupled to the second node, and a gate terminal coupled to the second output of the amplifier. The fifth transistor has a source terminal coupled to the voltage supply node, a drain terminal coupled to a third node, and a gate terminal coupled to the third output of the amplifier. The sixth transistor has a source terminal coupled to the ground node, a drain terminal coupled to the third node, and a gate terminal coupled to the fourth output of the amplifier. The seventh transistor has a source terminal coupled to the voltage supply node, a drain terminal coupled to a fourth node, and a gate terminal coupled to the third output of the amplifier. The eighth transistor has a source terminal coupled to the ground node, a drain terminal coupled to the fourth node, and a gate terminal coupled to the fourth output of the amplifier. The first resistor is coupled between the first node and the second node. The second resistor is coupled between the third node and the fourth node. The third resistor is coupled between the first node and the third node. The controller is coupled to the driver and the receiver.

BRIEF DESCRIPTION OF THE DRAWINGS

For a detailed description of various examples, reference will now be made to the accompanying drawings in which.

DETAILED DESCRIPTION

Ethernet-based communications form the backbone of the Internet, providing communications among countless network switches, routers, and servers that collectively form the Internet. Ethernet-based communications further enable countless user-devices to access the Internet or other networks. The Ethernet-based communications includes at least Ethernet connectors and Ethernet transmission lines that couple to Ethernet terminals of respective devices to communicatively couple the respective devices. Each of the respective devices includes a driver that drives signals transmitted in Ethernet-based communications. The transmissions occur, in various embodiments, according to one or more protocols or standards, such as 100Base-T, 10Base-Te, and/or any other number of suitable protocols or standards. Each of these protocols or standards, in some examples, includes different requirements, such as a differential amplitude of the transmission by the driver, signal loss, etc. Some drivers include separate hardware components for performing communication for performing communication according to 100Base-T and for performing communication according to 10Base-Te. However, having hardware components dedicated to each communication protocol increases the area consumed by a driver and the power consumed by the driver. Given the number of devices involved in Ethernet-based communications, a large number of drivers exist in Ethernet-based communication systems, further amplifying the increased size and power consumption of the drivers supporting multiple protocols, thereby presenting an opportunity for improvement.

At least some examples of the present disclosure provide for an Ethernet driver capable of supporting multiple protocols while having a reduced size and power consumption with respect to conventional Ethernet drivers that support multiple protocols. In at least some examples, the Ethernet driver operates based on a 3.3 volt (V) power supply and supports both 100Base-T communication and 10Base-Te communication, for example, via a single transmitter. For example, the Ethernet driver supports a 1.0V signal amplitude of 100Base-T communication and a 1.75V signal amplitude of 10Base-Te communication, each with a maximum signal loss of 16 decibels (dB). In at least some examples, the Ethernet drivers include one or more transistor networks configured to match an impedance of the driver to a line impendence of transmission lines.

Figure 1:
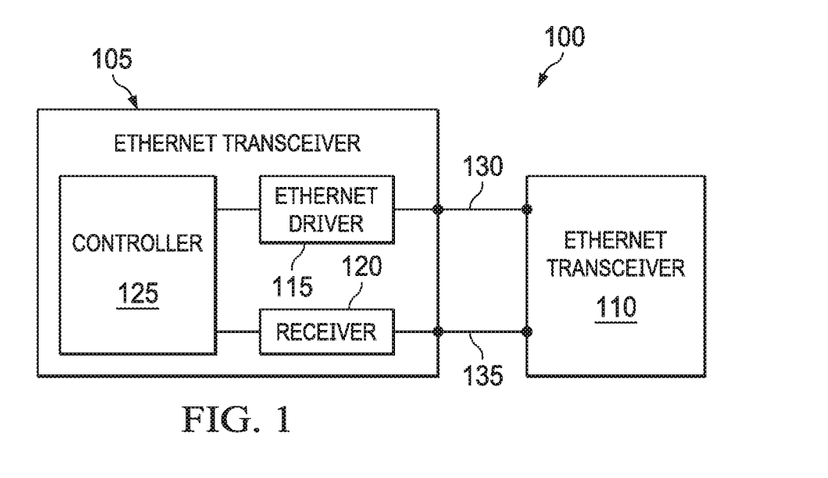
FIG. 1 shows a block diagram of an illustrative Ethernet-based communication system in accordance with various examples.

Turning now to FIG. 1, a block diagram of an illustrative Ethernet-based communication system 100 is shown. In some examples, the system 100 includes a Ethernet transceiver 105, a Ethernet transceiver 110, an Ethernet driver 115, a receiver 120, a controller 125, transmission lines 130, and transmission lines 135. While shown as singular lines, each of the transmission lines 130 and transmission lines 135 are, in some examples, representative of a plurality of transmission lines, such as a differential pair. In at least some examples, the Ethernet transceiver 105 includes the Ethernet driver 115, the receiver 120, and the controller 125. The transmission lines 130 couple the Ethernet transceiver 105 to the Ethernet transceiver 110 (e.g., from the Ethernet driver 115 to a receiver (not shown) of the Ethernet transceiver 110) and the transmission lines 135 couple the Ethernet transceiver 110 to the Ethernet transceiver 105 (e.g., from a driver (not shown) or transmitter (not shown) of the Ethernet transceiver 110 to the receiver 120 of the Ethernet transceiver 105). In some examples, the Ethernet transceiver 105 and the Ethernet transceiver 110 are substantially identical, while in other examples the Ethernet transceiver 105 and the Ethernet transceiver 110 vary in one or more of architecture and/or operation. In at least some examples, the Ethernet driver 115 is coupled to the transmission lines 130 and the controller 125 and the receiver 120 is coupled to the transmission lines 135 and the controller 125.

In an example of operation of the system 100, the Ethernet transceiver 105 communicates (e.g., transmits) data to the Ethernet transceiver 110 via the transmission lines 130. In at least some examples, the Ethernet transceiver 105 further receives data (e.g., at the receiver 120) from the Ethernet transceiver 110 via the transmission lines 135. The Ethernet transceiver 105 transmits data to the Ethernet transceiver 110, in at least some examples, via the Ethernet driver 115. In some examples, operation of the Ethernet driver 115 is at least partially controlled by the controller 125. For example, the controller 125 controls at least some components of the Ethernet driver 115 to convey data to the Ethernet driver 115 from the controller 125 for transmission by the Ethernet driver 115.

In at least some examples, the Ethernet transceiver 105 transmits data to the Ethernet transceiver 110 via one, or both, of a 100Base-T Ethernet protocol and/or a 10Base-Te Ethernet protocol. For example, in some architectures the Ethernet driver 115 is implemented as a current mode driver suitable for transmitting data according to both the 100Base-T Ethernet protocol and the 10Base-Te Ethernet protocol. In at least some examples, the controller 125 provides the data to the Ethernet driver 115 for transmission. In some examples, the Ethernet driver 115 further receives a clock signal from any suitable component (not shown) within, or external to, the Ethernet transceiver 105.

In at least some examples, the hardware architecture of the Ethernet driver 115 enables the Ethernet transceiver 105 to transmit the data according to both the 100Base-T Ethernet protocol and the 10Base-Te Ethernet protocol. For example, to at least partially enable the Ethernet transceiver 105 to transmit according to a plurality of communication protocols, the Ethernet driver 115 includes a one-to-N transistor network (not shown). In at least some examples, to further enable the Ethernet transceiver 105 to transmit according to a plurality of communication protocols the Ethernet driver 115 does not include a shunt or series internal termination (e.g., a resistor or other resistive element in an output signal path (not shown) of the Ethernet driver 115). In one example, the shunt internal termination would absorb, dissipate, and/or otherwise alter or affect at least a portion of a current flowing through the output signal path to the transmission lines 130 by the Ethernet transceiver 105, thereby increasing power consumption of the Ethernet transceiver 105. In another example, the series internal termination would absorb, dissipate, and/or otherwise alter or affect at least a portion of an output voltage provided via the output signal path to the transmission lines 130 by the Ethernet transceiver 105, thereby limiting the maximum differential output that the Ethernet transceiver 105 can provide.

Figure 2:
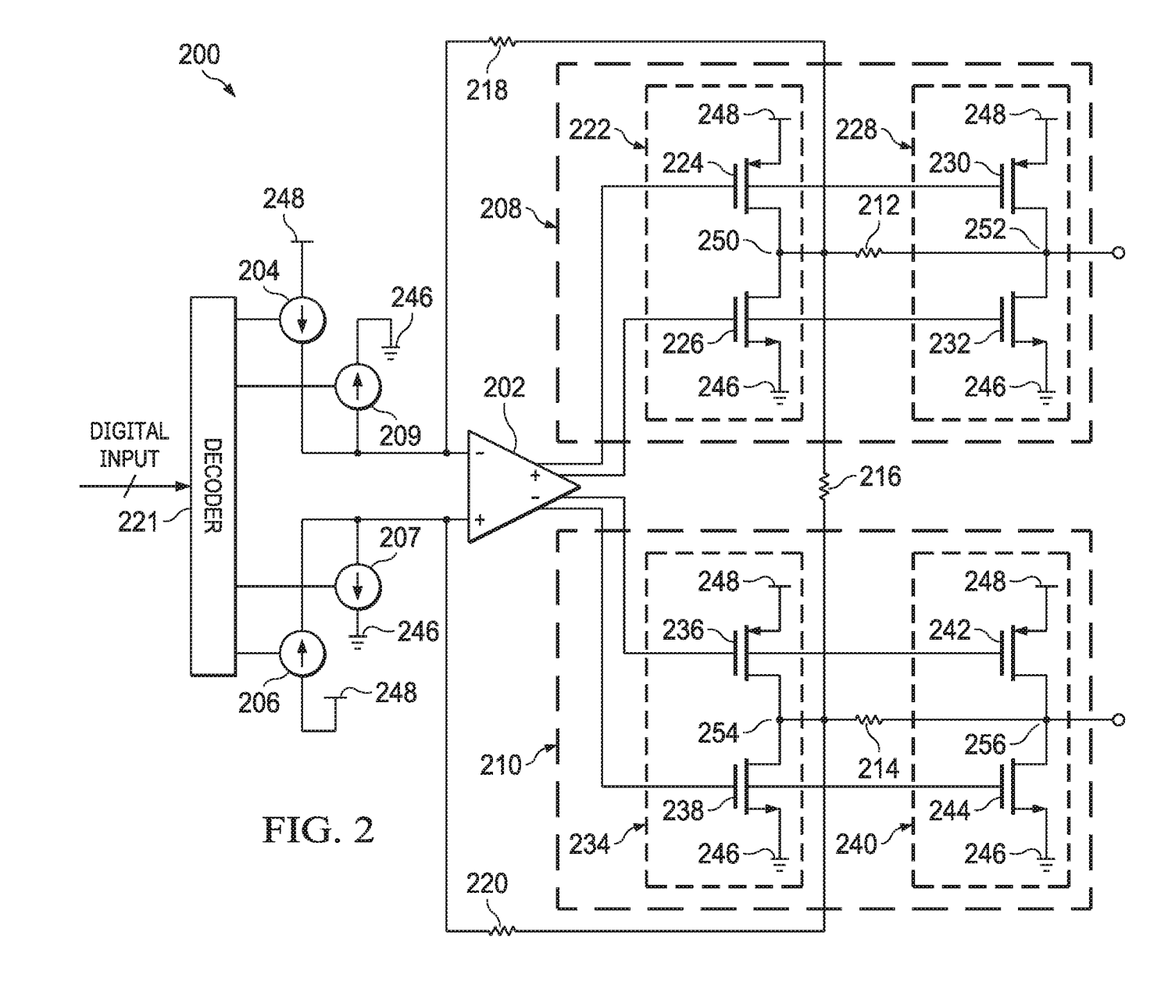
FIG. 2 shows a schematic diagram of an illustrative Ethernet driver in accordance with various examples.

Turning now to FIG. 2, a schematic diagram of an Ethernet driver 200 is shown. In at least some examples, the Ethernet driver 200 is suitable for implementation as the Ethernet driver 115 of the system 100, described above with respect to FIG. 1. The Ethernet driver 200 is configured, in at least one example, as a current-mode driver suitable for transmitting a signal according a plurality of communication protocols. In at least one example, the plurality of communication protocols includes at least a 100Base-T Ethernet protocol and the 10Base-Te Ethernet protocol. For example, at a first time, the Ethernet driver 200 transmits a signal according to the 100Base-T Ethernet protocol and at a second time the Ethernet driver 200 transmits a signal according to the 10Base-Te Ethernet protocol. Transmitting a signal according to the 100Base-T Ethernet protocol, in at least one example, includes transmitting the signal with a differential amplitude of 1.0 V. Transmitting a signal according to the 10Base-Te Ethernet protocol, in at least one example, includes transmitting the signal with a differential amplitude of 1.75 V.

In at least one example, the Ethernet driver 200 includes a differential amplifier 202, a first current source 204, a second current source 205, a third current source 206, a fourth current source 207, a first transistor network 208, a second transistor network 210, resistors 212, 214, 216, 218, and 220, and a decoder 221. The first transistor network 208 includes a first branch 222 comprising at least a transistor 224 and a transistor 226 and a second branch 228 comprising at least a transistor 230 and a transistor 232. The second transistor network 210 includes a first branch 234 comprising at least a transistor 236 and a transistor 238 and a second branch 240 comprising at least a transistor 242 and a transistor 244. In at least some examples, the transistor 224, transistor 230, transistor 236, and transistor 242 are each p-type metal oxide semiconductor field effect transistors (PMOS) and the transistor 226, transistor 232, transistor 238, and transistor 244 are n-type metal oxide semiconductor field effect transistors (NMOS). In at least one example, the Ethernet driver 200 is configured to both transmit with the differential amplitude of 1.0V and the differential amplitude of 1.75V. For example, in some architectures the Ethernet driver 200 is configured to transmit with the differential amplitude of 1.0V and/or the differential amplitude of 1.75V by altering a feedback resistance of the Ethernet driver 200. In other architectures, the Ethernet driver 200 is configured to transmit with the differential amplitude of 1.0V and/or the differential amplitude of 1.75V by altering an amount of current flowing through the first current source 204, the second current source 205, the third current source 206, and/or the fourth current source 207.

In at least one example architecture, the first current source 204 is coupled between a first input terminal (e.g., INM) of the differential amplifier 202 and a the supply node 248, the second current source 205 is coupled between the first input terminal of the differential amplifier 202 and a ground node 246, the third current source 206 is coupled between a second input terminal (e.g., INP) of the differential amplifier 202 and the supply node 248, and the fourth current source 207 is coupled between the second input terminal of the differential amplifier 202 and the ground node 246. In some examples, the first current source 204, the second current source 205, the third current source 206, and the fourth current source 207, along with decoder 221, together comprise, or functional substantially as, a digital-to-analog converter (DAC) configured to change their respective outputs based on a digital signal received by the decoder 221. For example, the first current source 204 and the third current source 206 are controlled current sources capable of sourcing current from the supply node 248 and the second current source 205 and the fourth current source 207 are controlled current sources capable of sinking current to the ground node 246, each according to a respective control signal received from the decoder 221 and determined by the decider 221 according to the digital signal received by the decoder 221. Accordingly, in at least some examples the decoder 221 is coupled to, or configured to couple to, a controller (not shown), such as the controller 125 of the system 100 of FIG. 1 from which the decoder receives the digital signal for control of the current sourcing or sinking of the first current source 204, second current source 205, third current source 206, and/or fourth current source 207.

Continuing with the example architecture of the Ethernet driver 200, a first output terminal of the differential amplifier 202 is coupled to gate terminals of transistor 224 and transistor 230. A second output terminal of the differential amplifier 202 is coupled to gate terminals of transistor 226 and transistor 232. A third output terminal of the differential amplifier 202 is coupled to gate terminals of transistor 236 and transistor 242. A fourth output of the differential amplifier 202 is coupled to gate terminals of the transistor 238 and the transistor 244.

A source terminal of the transistor 224 is coupled to a voltage supply node 248 and a drain terminal of the transistor 224 is coupled to a node 250. A source terminal of the transistor 230 is coupled to the voltage supply node 248 and a drain terminal of the transistor 230 is coupled to a node 252. A drain terminal of the transistor 226 is coupled to the node 250 and a source terminal of the transistor 226 is coupled to the ground node 246. A drain terminal of the transistor 232 is coupled to the node 252 and a source terminal of the transistor 232 is coupled to the ground node 246. The resistor 212 is coupled between the node 250 and the node 252. The resistor 218 is coupled between the node 250 and the first input of the differential amplifier 202.

A source terminal of the transistor 236 is coupled to the voltage supply node 248 and a drain terminal of the transistor 236 is coupled to a node 254. A source terminal of the transistor 242 is coupled to the voltage supply node 248 and a drain terminal of the transistor 242 is coupled to a node 256. A drain terminal of the transistor 238 is coupled to the node 254 and a source terminal of the transistor 238 is coupled to the ground node 246. A drain terminal of the transistor 244 is coupled to the node 256 and a source terminal of the transistor 244 is coupled to the ground node 246. The resistor 214 is coupled between the node 254 and the node 256. The resistor 220 is coupled between the node 254 and the second input of the differential amplifier 202.

The resistor 216 is coupled between the node 250 and the node 254. In at least some examples, the node 252 is a first output (e.g., OUTP) of the Ethernet driver 200 and the node 256 is a second output (e.g., OUTM) of the Ethernet driver 200.

In an example of operation of the Ethernet driver 200, a digital value is received by the decoder 221 and the decoder 221 generates control signals for controlling the first current source 204, the second current source 205, the third current source 206, and/or the fourth current source 207 to sink and/or source current from the first input of the differential amplifier 202 and/or the second input of the differential amplifier 202. The differential amplifier 202 amplifies the analog signals and controls the first transistor network 208 and the second transistor network 210 according to the amplified analog signals to generate an output signal present at nodes 252 and 256. For example, an amplified analog signal present at the first output of the differential amplifier 202 controls the transistor 224 and the transistor 230 such that the transistor 224 and the transistor 230 conduct between their respective source and drain terminals when the amplified analog signal is sufficiently negative with respect to a signal present at the voltage supply node 248. An amplified analog signal present at the second output of the differential amplifier 202 controls the transistor 226 and the transistor 232 such that the transistor 226 and the transistor 232 conduct between their respective source and drain terminals when the amplified analog signal is sufficiently large to exceed a threshold with respect to a ground voltage potential present at the ground node 246. Similarly, an amplified analog signal present at the third output of the differential amplifier 202 controls the transistor 236 and the transistor 242 such that the transistor 236 and the transistor 242 conduct between their respective source and drain terminals when the amplified analog signal is sufficiently negative with respect to the signal present at the voltage supply node 248. An amplified analog signal present at the fourth output of the differential amplifier 202 controls the transistor 238 and the transistor 244 such that the transistor 238 and the transistor 244 conduct between their respective source and drain terminals when the amplified analog signal is sufficiently large to exceed a threshold with respect to the ground voltage potential present at the ground node 246.

A width of the transistor 230, transistor 232, transistor 242, and transistor 244 is approximately N times greater than a width of the transistor 224, transistor 226, transistor 236, and transistor 238. For example, when the width of the transistor 224, transistor 226, transistor 236, and transistor 238 is X, the width of the transistor 230, transistor 232, transistor 242, and transistor 244 is N*X. Accordingly, approximately N times the current flows through the transistor 230, transistor 232, transistor 242, and transistor 244 as flows through the transistor 224, transistor 226, transistor 236, and transistor 238. N is determined, in various examples, according to a power requirement or any other suitable requirement, specification, or desired characteristic of the Ethernet driver 200. In one example, such as an example of the Ethernet driver 200 that supports transmitting signals according to the 100Base-T Ethernet protocol and the 10Base-Te Ethernet protocol, N is 10. In at least one example, the second branch 228 and the second branch 240 are each output stages that together form an output stage (not shown) of the Ethernet driver 200 and the first branch 222 and the first branch 234 are each mirrored stages that together form a mirrored stage (not shown) of the output stage of the Ethernet driver 200. The resistor 216 loads the mirrored stage with an impedance equal to N times an impedance of a load to which the node 252 and the node 256 are configured to couple. The resistor 216, in some examples, is programmable such that an impedance of the resistor 216 varies based on a control signal received by the resistor 216. In other examples, the resistor 216 has a set value established at a time of manufacture of the Ethernet driver 200. In at least some examples, the resistor 218 and the resistor 220 provide negative feedback from the mirrored stage to the input terminals of the differential amplifier 202 to facilitate current flow to the resistor 216.

As previously discussed, conventional drivers include an internal shunt termination that provides impedance matching for a load to which the drivers are configured to couple. However, also as previously discussed, the Ethernet driver 200 lacks internal shunt termination, partially enabling the Ethernet driver 200 to transmit signals according to the 100Base-T Ethernet protocol and the 10Base-Te Ethernet protocol. However, impedance matching is still required in some examples to maintain integrity of signals output by the Ethernet driver 200 at the node 252 and the node 256. Accordingly, in at least some examples, the resistor 212 and the resistor 214 provide impedance matching for the Ethernet driver 200 but do not absorb, dissipate, and/or otherwise alter or affect output signals of the Ethernet driver 200 present at the node 252 and/or the node 256. In some examples, impedance values of the resistor 212 and the resistor 214 are approximately equal and determined according to the following equation 1 in which R is the impedance value of the resistor 212 and the resistor 214, N is as described above, and $R_L$ is the impedance value to which the Ethernet driver 200 is being matched (e.g., the impedance value of a load to which the Ethernet driver 200 is configured to couple at node 252 and node 256).

$$R = (N+1)\frac{R_L}{2} \qquad \text{equation 1}$$

Figure 3:
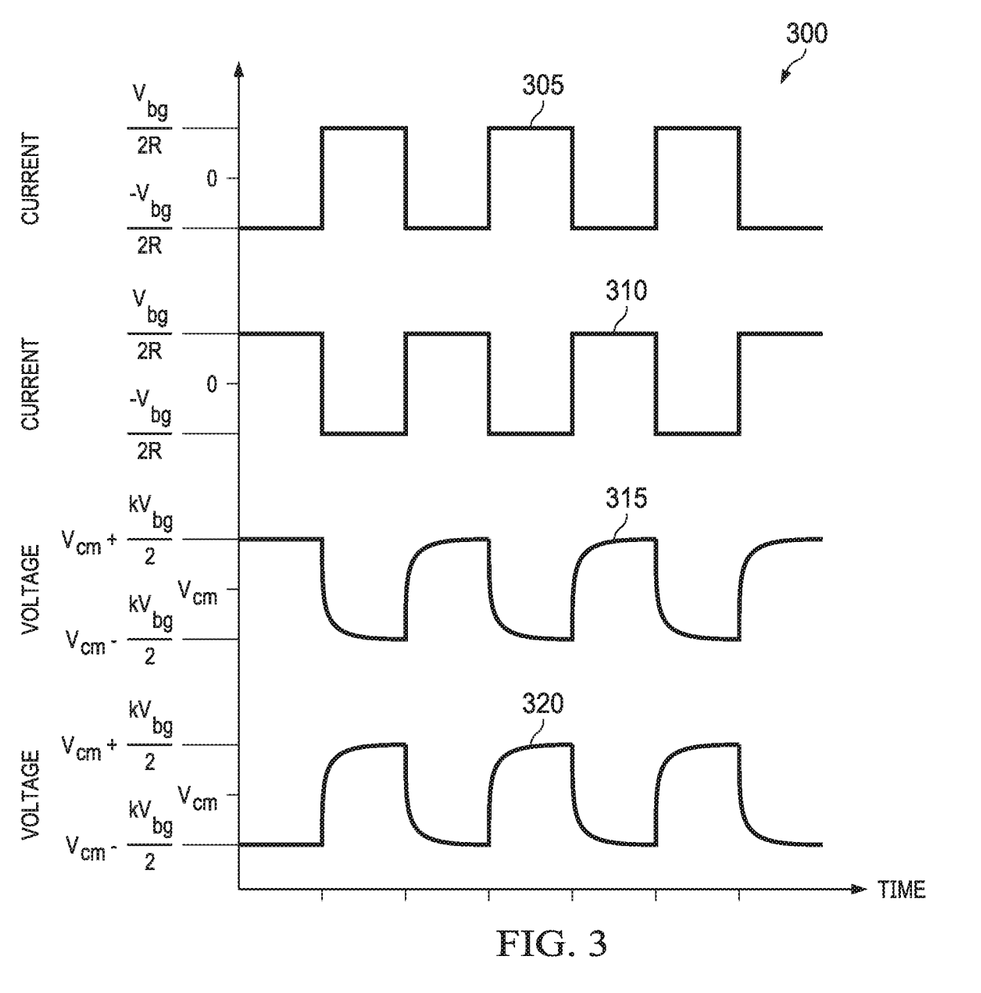
FIG. 3 shows a timing diagram of illustrative signals in accordance with various examples.

Turning now to FIG. 3 a timing diagram 300 of illustrative signals is shown. The timing diagram 300 is representative of at least some signals present in a circuit, such as the Ethernet driver 200, discussed above with reference to FIG. 2. Accordingly, timing diagram 300 is discussed with reference to the components of the Ethernet driver 200 of FIG. 2. In at least some examples, the timing diagram 300 relates input current to output voltage of the Ethernet driver 200. For example, the timing diagram 300 illustrates a current signal 305 received at the first input terminal of the differential amplifier 202, a current signal 310 received at the second input terminal of the differential amplifier 202, a voltage signal 315 present at node 250, and a voltage signal 320 present at node 254. As used in FIG. 3 and in the following FIG. 4, $V_{cm}$ is the common mode voltage being maintained in the Ethernet driver 200 and $V_{bg}$ is an internally generated bandgap reference voltage for use by the differential amplifier 202 and generated by a transceiver in which the Ethernet driver 200 is implemented. For example, $V_{bg}/R_1$ is a current signal generated internally by the differential amplifier 202 by mirroring the current flowing through a reference resistor (not shown) internal to the differential amplifier 202 and having a resistance $R_1$ and a voltage difference between its terminals of Vbg. In at least some examples, $V_{bg}/R_1$ is about equal to a total differential current present at the first input of the differential amplifier 202 and the second input of the differential amplifier 202. Additionally, k is a ratio of resistance values of feedback resistors 218 and 220 to the resistance $R_1$ of the reference resistor internal to the differential amplifier 202.

Figure 4:
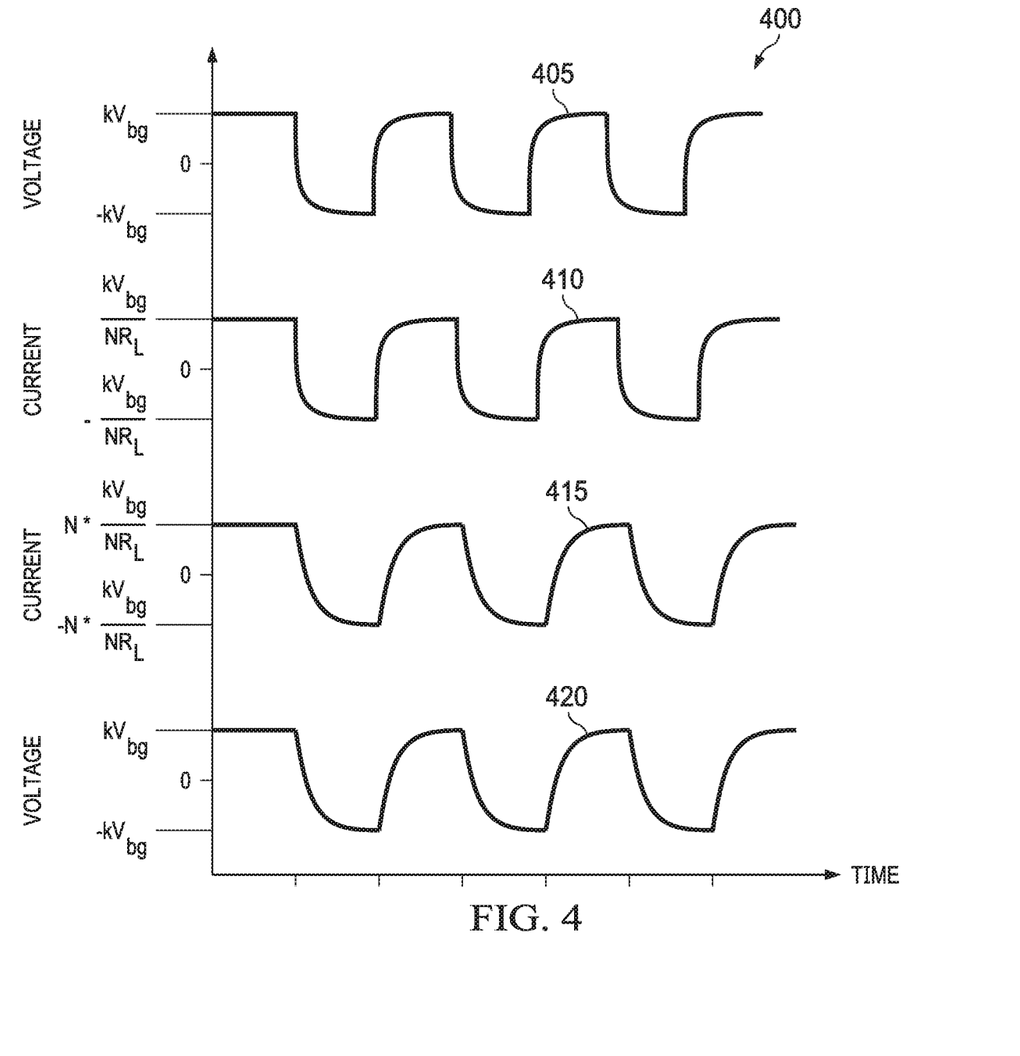
FIG. 4 shows a timing diagram of illustrative signals in accordance with various examples.

Turning now to FIG. 4 a timing diagram 400 of illustrative signals is shown. The diagram 400 is representative of at least some signals present in a circuit, such as the Ethernet driver 200, discussed above with reference to FIG. 2. Accordingly, timing diagram 400 is discussed with reference to the components of the Ethernet driver 200 of FIG. 2. In at least some examples, the timing diagram 400 relates to current and voltage signals of mirrored and output stages of the Ethernet driver 200. For example, the timing diagram 400 illustrates a differential voltage signal 405 measured between the node 250 and the node 254 (e.g., a differential output signal of the mirrored stage), a current signal 410 of a mirrored stage flowing through the resistor 216, a current signal 415 of an output stage flowing through a load coupled to the node 252 and the node 256, and a differential voltage signal 420 measure between the node 252 and the node 256 (e.g., a differential output signal of the output stage). As illustrated by the timing diagram 400, an amount of current flowing through the output stage is approximately N times the amount of current flowing through the mirrored stage and voltages of the mirrored stage are approximately equal to voltages of the output stage.

Figure 5:
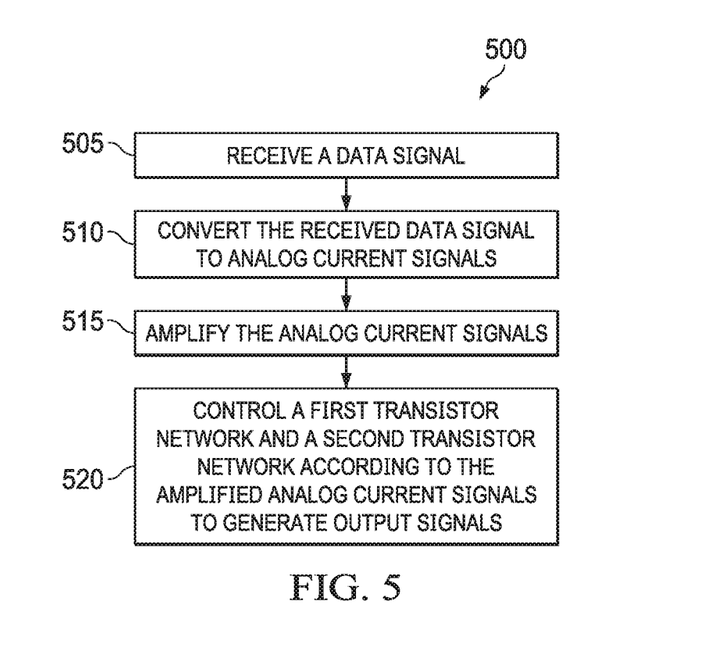
FIG. 5 shows a flowchart of an illustrative method in accordance with various examples.

Turning now to FIG. 5, a flowchart of an illustrative method 500 is shown. The method 500 is implemented, in some examples, by a circuit such as the Ethernet driver 200, described above with respect to FIG. 2. In some examples, the method 500 enables a driver to transmit data according to a plurality of transmission protocols. For example, the method 500 enables an Ethernet driver such as the Ethernet driver 200 to transmit signals according to the 100Base-T Ethernet protocol and the 10Base-Te Ethernet protocol.

At operation 505, the Ethernet driver receives a data signal. The data signal is, in at least some examples, a digital value received by a DAC from a controller or other digital element such as a processor. The DAC is, in some examples, implemented as a pair of controllable current sources. At operation 510, the data signal is converted to analog current signals. For example, the data signal is converter to a pair of inversely related analog current signals. At operation 515, the analog current signals are amplified. In some examples, a fully differential current-mode amplifier amplifies the analog current signals.

At operation 520, the amplifier controls a first transistor network and a second transistor network to generate output signals of the Ethernet driver. For example, the amplifier controls the first transistor network according to a first output signal and a second output signal and controls the second transistor network according to a third and a fourth output signal, where the first and second output signals are opposite in polarity and phase and wherein the third and fourth output signals are opposite in polarity and phase. In some examples, controlling the first transistor network comprises controlling a first mirrored stage of transistors and a first output stage of transistors and controlling the second transistor network comprises controlling a second mirrored stage of transistors and a second output stage of transistors. In at least some examples, the first mirrored stage, the second mirrored stage, the first output stage, and the second output stage are configured such that N times an amount of current flowing through the first mirrored stage and the second mirrored stage flows through the first output stage and the second output stage. In at least some examples, controlling the first mirrored stage and the second mirrored stage facilitates impedance matching of the Ethernet driver without utilizing series impedance matching terminations within the Ethernet driver.

In the foregoing discussion, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device, element, or component couples to a second device, element, or component, that coupling may be through a direct coupling or through an indirect coupling via other devices, elements, or components and connections. Similarly, a device, element, or component that is coupled between a first component or location and a second component or location may be through a direct connection or through an indirect connection via other devices, elements, or components and/or couplings. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is said to include certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure either at a time of manufacture or after a time of manufacture, for example, by an end-user and/or a third-party.

While certain components are described herein as being of a particular process technology (e.g., field effect transistor (FET), metal oxide semiconductor FET (MOSFET), n-type, p-type, etc.), these components may be exchanged for components of other process technologies (e.g., replace FET and/or MOSFET with bi-polar junction transistor (BJT), replace n-type with p-type or vice versa, etc.) and reconfiguring circuits including the replaced components to provide desired functionality at least partially similar to functionality available prior to the component replacement. Components illustrated as resistors, unless otherwise stated, are generally representative of any one or more elements coupled in series and/or parallel to provide an amount of impedance represented by the illustrated resistor. Additionally, uses of the phrase "ground voltage potential" in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about", "approximately", or "substantially" preceding a value means+/−10 percent of the stated value.

The above discussion is meant to be illustrative of the principles and various examples of the present disclosure. Numerous variations and modifications will become apparent to those skilled in the art once the above disclosure is fully appreciated. It is intended that the present disclosure be interpreted to embrace all such variations and modifications.

What is claimed is:

1. A circuit, comprising:
an amplifier having first and second inputs and first, second, third, and fourth outputs;
a first transistor network coupled to the first output of the amplifier and the second output of the amplifier;
a second transistor network coupled to the third output of the amplifier and the fourth output of the amplifier;
a first resistor coupled between the first transistor network and the second transistor network;
a second resistor coupled between the first transistor network and the first input of the amplifier; and
a third resistor coupled between the second transistor network and the second input of the amplifier;
wherein the first transistor network comprises:
a first mirrored stage comprising a first transistor and a second transistor; and
a first output stage comprising a third transistor and a fourth transistor.

2. The circuit of claim 1, wherein a source terminal of the first transistor is coupled to a voltage supply node, a drain terminal of the first transistor is coupled to a first node, and a gate terminal of the first transistor is coupled to the first output of the amplifier, wherein a drain terminal of the second transistor is coupled to the first node, a source terminal of the second transistor is coupled to a ground node, and a gate terminal of the second transistor is coupled to the second output of the amplifier, wherein a source terminal of the third transistor is coupled to the voltage supply node, a drain terminal of the third transistor is coupled to a second node, and a gate terminal of the third transistor is coupled to the first output of the amplifier, and wherein a drain terminal of the fourth transistor is coupled to the second node, a source terminal of the fourth transistor is coupled to the ground node, and a gate terminal of the fourth transistor is coupled to the second output of the amplifier.

3. The circuit of claim 2, wherein the first transistor network further comprises a fourth resistor coupled between the first node and the second node, and wherein the second resistor is coupled between the first node and the first input of the amplifier.

4. A circuit, comprising:
an amplifier having first and second inputs and first, second, third, and fourth outputs;
a first transistor network coupled to the first output of the amplifier and the second output of the amplifier;
a second transistor network coupled to the third output of the amplifier and the fourth output of the amplifier;
a first resistor coupled between the first transistor network and the second transistor network;
a second resistor coupled between the first transistor network and the first input of the amplifier; and
a third resistor coupled between the second transistor network and the second input of the amplifier;
wherein the second transistor network comprises:
a second mirrored stage comprising a fifth transistor and a sixth transistor; and
a second output stage comprising a seventh transistor and an eighth transistor.

5. The circuit of claim 4, wherein a source terminal of the fifth transistor is coupled to a voltage supply node, a drain terminal of the fifth transistor is coupled to a third node, and a gate terminal of the fifth transistor is coupled to the third output of the amplifier, wherein a drain terminal of the sixth transistor is coupled to the third node, a source terminal of the sixth transistor is coupled to a ground node, and a gate terminal of the sixth transistor is coupled to the fourth output of the amplifier, wherein a source terminal of the seventh transistor is coupled to the voltage supply node, a drain terminal of the seventh transistor is coupled to a fourth node, and a gate terminal of the seventh transistor is coupled to the third output of the amplifier, and wherein a drain terminal of the eighth transistor is coupled to the fourth node, a source terminal of the eighth transistor is coupled to the ground node, and a gate terminal of the eighth transistor is coupled to the fourth output of the amplifier.

6. The circuit of claim 5, wherein the second transistor network further comprises a fifth resistor coupled between the third node and the fourth node, and wherein the third resistor is coupled between the third node and the second input of the amplifier.

7. The circuit of claim 5, wherein the first resistor is coupled between the first node and the third node.

8. A circuit, comprising:
an amplifier having first and second inputs and first, second, third, and fourth outputs;
a first transistor network coupled to the first output of the amplifier and the second output of the amplifier;
a second transistor network coupled to the third output of the amplifier and the fourth output of the amplifier;
a first resistor coupled between the first transistor network and the second transistor network;
a second resistor coupled between the first transistor network and the first input of the amplifier; and
a third resistor coupled between the second transistor network and the second input of the amplifier;
further comprising:
a first current source coupled between the first input of the amplifier and a voltage supply node;
a second current source coupled between the first input of the amplifier and a ground node;
a third current source coupled between the second input of the amplifier and the voltage supply node; and
a fourth current source coupled between the second input of the amplifier and the ground node.

9. A circuit, comprising:
a fully-differential amplifier having first and second inputs and first, second, third, and fourth outputs;
an output transistor stage;
a mirrored transistor stage;
a first resistor coupled between the mirrored transistor stage and the output transistor stage;
a second resistor coupled between the mirrored transistor stage and the output transistor stage; and
a third resistor coupled between first resistor and the second resistor;
wherein the mirrored transistor stage comprises:
a first transistor having a source terminal coupled to a voltage supply node, a drain terminal coupled to a first node, and a gate terminal coupled to the first output of the amplifier;
a second transistor having a source terminal coupled to a ground node, a drain terminal coupled to the first node, and a gate terminal coupled to the second output of the amplifier;
a third transistor having a source terminal coupled to the voltage supply node, a drain terminal coupled to a second node, and a gate terminal coupled to the third output of the amplifier; and
a fourth transistor having a source terminal coupled to the ground node, a drain terminal coupled to the second node, and a gate terminal coupled to the fourth output of the amplifier.

10. The circuit of claim 9, wherein the output transistor stage comprises:
a fifth transistor having a source terminal coupled to the voltage supply node, a drain terminal coupled to a third node, and a gate terminal coupled to the first output of the amplifier;
a sixth transistor having a source terminal coupled to the ground node, a drain terminal coupled to the third node, and a gate terminal coupled to the second output of the amplifier;
a seventh transistor having a source terminal coupled to the voltage supply node, a drain terminal coupled to a fourth node, and a gate terminal coupled to the third output of the amplifier; and
an eighth transistor having a source terminal coupled to the ground node, a drain terminal coupled to the fourth node, and a gate terminal coupled to the fourth output of the amplifier.

11. The circuit of claim 10, wherein the first resistor is coupled between the first node and the third node, wherein the second resistor is coupled between the second node and the fourth node, and wherein the third resistor is coupled between the first node and the second node.

12. The circuit of claim 11, further comprising:
a fourth resistor coupled between the first node and the first input of the amplifier; and
a fifth resistor coupled between the second node and the second input of the amplifier.

13. The circuit of claim 12, further comprising:
a first current source coupled between the first input of the amplifier and a voltage supply node;
a second current source coupled between the first input of the amplifier and a ground node;
a third current source coupled between the second input of the amplifier and the voltage supply node; and
a fourth current source coupled between the second input of the amplifier and the ground node.

14. A circuit, comprising:
a current-mode driver, comprising:
a fully-differential amplifier having first and second inputs and first, second, third, and fourth outputs;
a first transistor network comprising:
a first transistor having a source terminal coupled to a voltage supply node, a drain terminal coupled to a first node, and a gate terminal coupled to the first output of the amplifier;
a second transistor having a source terminal coupled to a ground node, a drain terminal coupled to the first node, and a gate terminal coupled to the second output of the amplifier;
a third transistor having a source terminal coupled to the voltage supply node, a drain terminal coupled to a second node, and a gate terminal coupled to the first output of the amplifier;
a fourth transistor having a source terminal coupled to the ground node, a drain terminal coupled to the second node, and a gate terminal coupled to the second output of the amplifier;
a second transistor network comprising:
a fifth transistor having a source terminal coupled to the voltage supply node, a drain terminal coupled to a third node, and a gate terminal coupled to the third output of the amplifier; and a sixth transistor having a source terminal coupled to the ground node, a drain terminal coupled to the third node, and a gate terminal coupled to the fourth output of the amplifier;

a seventh transistor having a source terminal coupled to the voltage supply node, a drain terminal coupled to a fourth node, and a gate terminal coupled to the third output of the amplifier; and an eighth transistor having a source terminal coupled to the ground node, a drain terminal coupled to the fourth node, and a gate terminal coupled to the fourth output of the amplifier;

a first resistor coupled between the first node and the second node;

a second resistor coupled between the third node and the fourth node; and a third resistor coupled between the first node and the third node;

a receiver; and a controller coupled to the current-mode driver and the receiver.

15. The circuit of claim 14, further comprising:
a first current source coupled between the first input of the amplifier and a voltage supply node;
a second current source coupled between the first input of the amplifier and a ground node;
a third current source coupled between the second input of the amplifier and the voltage supply node; and
a fourth current source coupled between the second input of the amplifier and the ground node.

16. The circuit of claim 15, wherein the controller is configured to couple to a decoder configured to at least partially control output of the first current source, the second current source, the third current source, and the fourth current source.

17. The circuit of claim 16, further comprising:
a fourth resistor coupled between the first node and the first input of the amplifier; and
a fifth resistor coupled between the third node and the second input of the amplifier.

18. The circuit of claim 17, wherein a width of each of the third transistor, the fourth transistor, the seventh transistor, and the eighth transistor is approximately N times greater than a width of each of the first transistor, the second transistor, the fifth transistor, and the sixth transistor.

* * * * *